(12) United States Patent
Burckel

(10) Patent No.: US 8,197,887 B1
(45) Date of Patent: Jun. 12, 2012

(54) THREE-DIMENSIONAL METAMATERIALS

(75) Inventor: David Bruce Burckel, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 385 days.

(21) Appl. No.: 12/512,082

(22) Filed: Jul. 30, 2009

(51) Int. Cl.
*B05D 5/12* (2006.01)
(52) U.S. Cl. ...... 427/97.7; 427/98.4; 427/100; 427/236; 427/237; 427/282
(58) Field of Classification Search ............ 427/58, 427/77, 97.1, 100, 97.7, 98.4, 236, 237, 282
See application file for complete search history.

(56) References Cited

U.S. PATENT DOCUMENTS

| | | | | |
|---|---|---|---|---|
| 3,363,119 A * | 1/1968 | Koneval et al. | ............. | 310/320 |
| 3,528,851 A * | 9/1970 | Curran et al. | ................ | 427/100 |
| 6,391,674 B2 * | 5/2002 | Ziegler | ............................ | 438/52 |
| 7,802,360 B2 * | 9/2010 | Pai et al. | ......................... | 29/852 |
| 2008/0073318 A1 * | 3/2008 | Saito | ............................. | 216/17 |

* cited by examiner

*Primary Examiner* — Brian K Talbot
(74) *Attorney, Agent, or Firm* — Kevin W. Bieg

(57) ABSTRACT

A fabrication method is capable of creating canonical metamaterial structures arrayed in a three-dimensional geometry. The method uses a membrane suspended over a cavity with predefined pattern as a directional evaporation mask. Metallic and/or dielectric material can be evaporated at high vacuum through the patterned membrane to deposit resonator structures on the interior walls of the cavity, thereby providing a unit cell of micron-scale dimension. The method can produce volumetric metamaterial structures comprising layers of such unit cells of resonator structures.

16 Claims, 7 Drawing Sheets

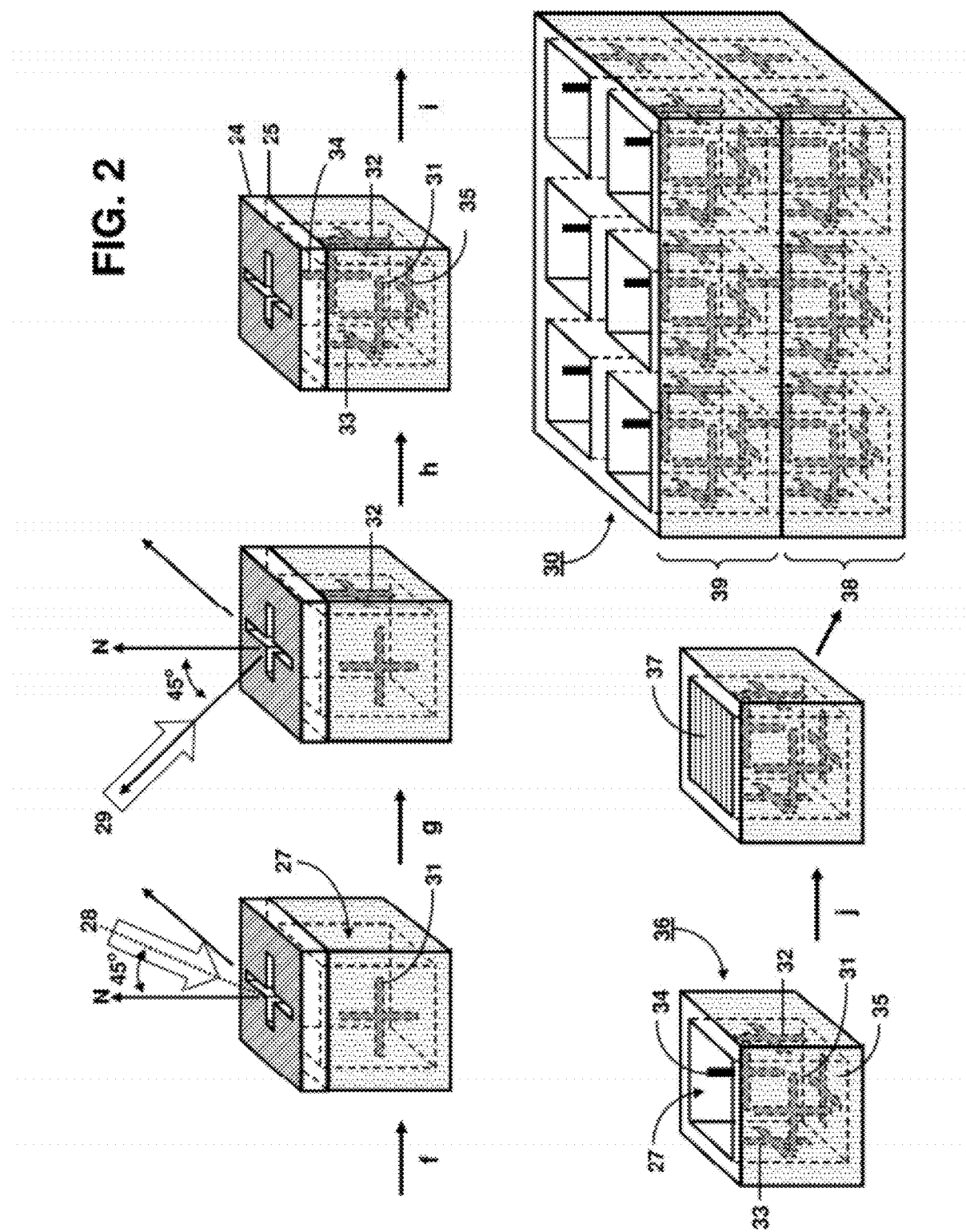

THREE-DIMENSIONAL METAMATERIALS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to metamaterials and, in particular, to three-dimensional metamaterials that operate at infrared and optical frequencies.

BACKGROUND OF THE INVENTION

Metamaterials are artificially structured materials in which both the electric permittivity and the magnetic permeability μ are tunable. Such materials can possess a negative index of refraction and are sometimes referred to as "left-handed," when the wave vector is antiparallel to the usual right-handed cross product of the electric and magnetic fields characteristic of naturally occurring materials. Metamaterials have electromagnetic properties that are difficult or impossible to achieve with conventional right-handed materials, the most notable being the negative refractivity. These unconventional properties suggest a number of unique applications, including compact aberration-free lenses, subwavelength imaging, and cloaking. However, although materials with negative electric permittivity are readily available at low frequencies, including metals below the ultraviolet region and doped semiconductors in the terahertz and infrared regions, existing materials with negative magnetic permeability typically lose their magnetic activity at much lower frequencies. Therefore, until recently, artificial metamaterials having both negative permittivity and negative permeability in the same frequency range were difficult to realize in practice.

However, in the late 90s, Pendry proposed a practical split-ring resonator (SRR) structure that can be used to achieve a negative permeability in the vicinity of a magnetic resonance frequency. See J. B. Pendry et al. *IEEE Trans. Microwave Theory Tech.* 47, 2075 (1999). When combined with continuous wires, one can simultaneously obtain a negative permittivity and a negative permeability, thereby exhibiting a left-handed index of refraction. See D. R. Smith et al., *Phys. Rev. Lett.* 84, 4184 (2000). As shown in FIG. 1 the simplest form of the SRR 10 is planar metallic ring 11 with a gap 12. The ring 11 has an outer dimension l and a metal linewidth w. The gap 12 has a width g. In essence, the SRR 10 is a small LC circuit consisting of an inductance L and a capacitance C. The ring 11 forms one winding of a coil (the inductance), and the ends form the plates of a capacitor. Electromagnetic radiation directed into the plane of the SRR induces a ring current I in the ring. Metamaterials comprise an array of such subwavelength metallic resonator structures within or on an electrically insulating or semiconducting substrate. Dense packing of SRRs, using lattice constants smaller than the LC resonance wavelength, creates a metamaterial that can exhibit a magnetic and electric resonance at the resonant frequency, $\omega_{LC} = 1/\sqrt{LC}$. Two resonances are observed when exciting the SRR structure shown with incident radiation having polarization perpendicular to the gap (i.e., electric field E parallel to the arm containing the gap, as shown). The LC resonance corresponding to the ring current leads to a magnetic dipole moment perpendicular to the SRR plane and an electric dipole moment parallel to the incident electric field. A shorter wavelength Mie resonance is also excited, corresponding to an electric dipole oscillating in the arm opposite the gap. With incident radiation polarized parallel to the gap, only a Mie resonance corresponding to electric dipoles oscillating in the two arms parallel to the gap is observed. The resonances can be strengthened by adding additional, concentric rings, each ring having a gap, to the simple SRR structure. Other resonant structures can also be designed and implemented.

In principle, the resonator response is scalable from radio to infrared and optical frequencies. See D. R. Smith et al., *Phys. Rev. Lett.* 84, 4184 (2000); J. B. Pendry et al., *Science* 312, 1780 (2006); R A. Shelby et al., *Science* 292, 77 (2001); and C. Enkrich et al., *Phys. Rev. Lett.* 95, 203901 (2005). For the simple SRR described above, both the inductance and capacitance scale proportionally to SRR size, provided that all SRR dimensions are scaled down simultaneously and that the metal retains a high conductivity. Therefore, the resonant frequency scales inversely with a normalized size. Therefore, metamaterials have the potential to provide a scale-invariant design paradigm to create functional materials which can enhance our ability to manipulate, control, and detect electromagnetic radiation.

In practice, however, extrapolation of metamaterial concepts to shorter wavelengths has challenged every aspect of design, electromagnetic modeling, micro-fabrication and optical characterization. Material losses have scaled non-linearly with reduction in dimension, while the design space has focused predominately on planar SRRs, cut-wire pairs (CWPs), or fishnet-like structures. In particular, ohmic losses in metal become significant at optical/IR frequencies. Fabrication of planar optical/IR metamaterial structures such as SRRs and CWPs typically requires advanced lithography, such as e-beam, just to achieve patterning at these dimensions. For example, infrared metamaterials require linewidths in the hundreds of nanometers size scale, which is difficult for all but cutting edge lithography. See J. B. Pendry et al., *IEEE Trans. Microwave Theory and Tech.* 47, 2075 (1999); V. M. Shalaev et al., *Optics Lett.* 30, 3356 (2005); and S. Zhang et al., *Phys. Rev. Lett.* 95, 137404 (2005).

Further, planar metamaterial structures are highly anisotropic. Therefore, many device applications require the fabrication of three-dimensional (3D) metamaterials. Such 3D structures enable full coupling of incident electromagnetic radiation in two or three orthogonal directions. 3D metamaterial fabrication at microwave frequencies is aided by the ability to fabricate optimal resonator structures and then assemble them into the optimal 3D metamaterial geometry. However, the creation and assembly of 3D geometries at size scales required for IR and optical metamaterials is inherently difficult. In particular, the placement/orientation of the resultant structure out of the plane of fabrication is not currently possible at scales suitable for IR and optical frequencies. The vision of truly isotropic 3D metamaterials operating in the IR and visible wavelength ranges will require breakthrough advances in fabrication to achieve relevant sub-wavelength dimensions. As a result, most published work on fabrication of 3D metamaterials in the optical/IR wavelength range leverages e-beam written planar or stacked planar structures, while modeling has predominately focused on planar, stacked planar, and/or 3D cubic structures.

The present invention enables the fabrication of 3D metamaterials with micron-scale characteristic dimensions. The method relies on standard lithography to create the canonical metamaterial resonator geometry (SRR, CWP, etc), but then uses a combination of processing sequence and directional projection evaporation to replicate the resonator geometry onto surfaces normal to the lithography plane. The invention also enables fabrication of resonators on curved surfaces with radius of curvature on the order of the size of the resonator. The result is a methodology for construction of complex 3D metamaterial structures. The process is scalable to large areas and can be stacked to achieve macroscopic 3D volumes of material.

SUMMARY OF THE INVENTION

The present invention is directed to a method for fabricating a three-dimensional metamaterial, comprising forming a patterned membrane over a cavity in a matrix material, wherein the patterned membrane comprises at least one mask opening that images a resonator structure, and depositing at least one resonator structure on an interior surface of the cavity through the patterned membrane. A patterned membrane can be formed over a cavity by forming the patterned membrane over the matrix material and then etching the cavity through the mask opening(s) by self-aligned cavity membrane projection lithography. Alternatively, the patterned membrane can be formed over a cavity by forming a cavity in the matrix material, depositing a sacrificial backfill material into the cavity, planarizing the surface of the deposited sacrificial backfill material, depositing a membrane layer on the planarized backfill material, patterning the membrane layer to provide the mask opening(s), and removing the sacrificial backfill material through the mask opening(s). The patterned membrane can then be removed, for example by a lift off process, to expose the cavity with the deposited resonator structures on the interior surface of the cavity. A volumetric array of metamaterial can be formed by forming a planar array of such unit cell cavities in a plane of the matrix material then building up additional planes of unit cells by a layer-by-layer process.

The invention is further directed to a three-dimensional metamaterial comprising a plurality of unit cells, wherein each unit cell comprises at least one resonator structure on an inner surface of a cavity formed in a matrix material. Multiple layers of planar array of unit cells can provide a volumetric metamaterial.

The method of the present invention enables the fabrication of metamaterial resonators on curved surfaces. In addition to providing a new route to fabrication of micron and sub-micron scale resonators with out-of-plane electrical current components, this method enables the fabrication of resonators with current distributions which are inherently non-coplanar. Given the dramatic demonstrations of metamaterial fabrication and optical behavior using planar "atomic" components such as SRRs and cut-wire pairs, the fabrication of resonators with rationally designed arbitrary current distributions can provide more flexibility and performance in metamaterial designs. Creation of truly 3D current paths offers the potential to create atoms with custom designed magnetization vectors, where the resulting induced magnetization vector can be oriented along an arbitrary direction within the unit cell. The fabrication method requires only standard planar processing equipment, but can be used to create a wide variety of complex 3-D metamaterial structures.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 4a shows overlapping split ring resonators created with 3 separate evaporations. FIG. 4b shows overlapping symmetric wire pairs created with 3 evaporations. FIG. 4c shows angled SEM picture showing curvature. FIG. 4d shows a cross-sectional SEM image demonstrating isotropy of the cavity etch.

FIG. 6a shows a top-down SEM image of a patterned membrane PMMA membrane above a self-aligned cavity. FIG. 6b shows an array of C-shaped resonators in a spherical cavity after four consecutive evaporations and lift off of the membrane. FIG. 6c shows a planar array of metamaterial cavities.

DETAILED DESCRIPTION OF THE INVENTION

The present invention is directed to three-dimensional metamaterials and methods for fabricating such metamaterials. The basic premise behind the membrane projection lithography (MPL) method of the present invention is to use standard planar fabrication techniques to create non-planar structures. The fabrication method enables creation of complex 3D geometries of canonical metamaterial structures. The method can be used to fabricate resonator patterns over large areas using standard semiconductor processing equipment and materials. In principle the method can be used to fabricate metamaterials with unit cell dimensions ranging from centimeters (i.e., RF and microwave metamaterials) to sub-micron dimensions. However, it is particularly useful for the fabrication of IR and optical metamaterials, with unit cell dimensions of approximately 0.1 to 5 microns. The method is flexible and straightforward.

Method of Fabrication by Membrane Projection Lithography

Figure 1:
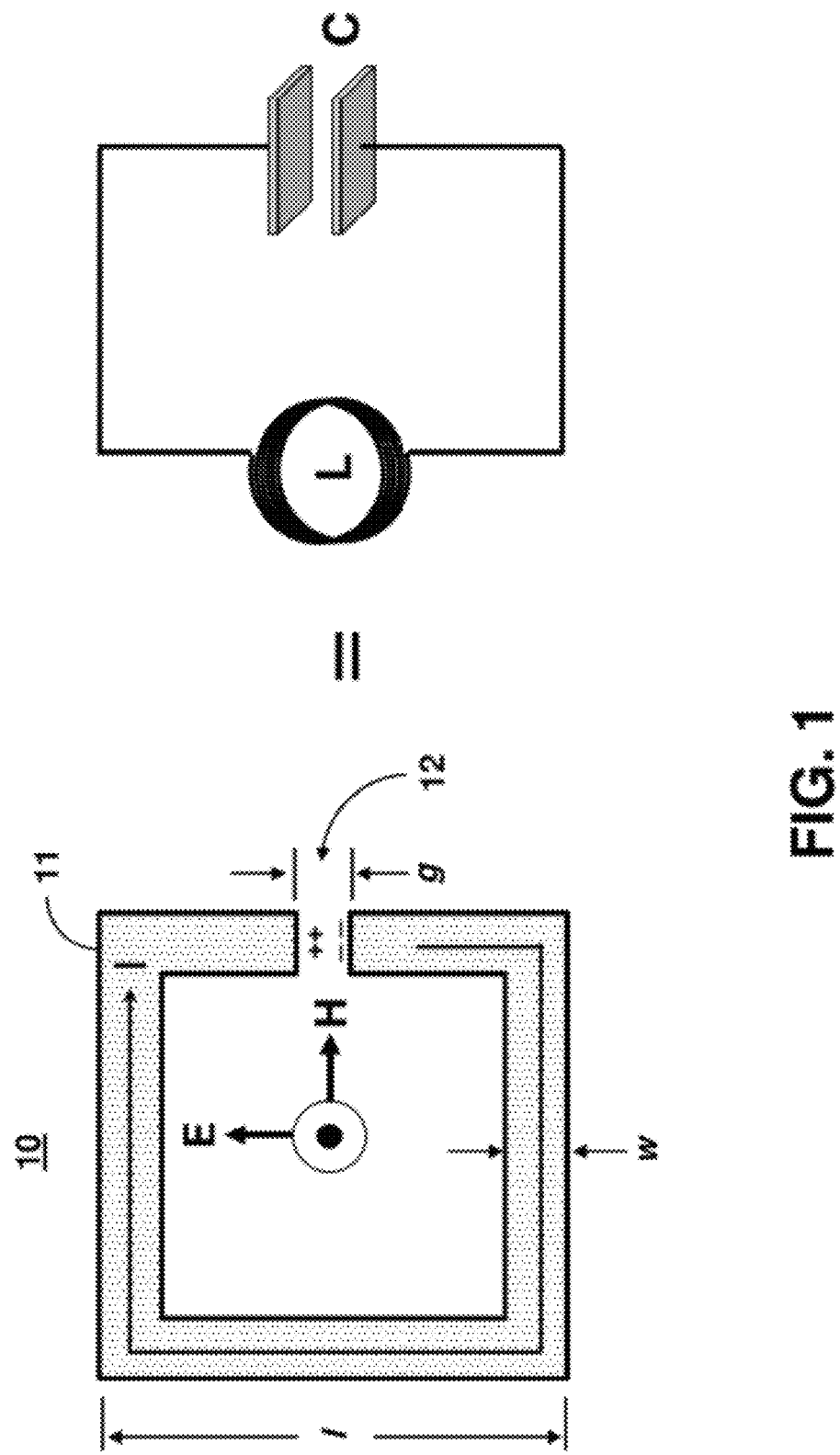
FIG. 1 is a schematic illustration of a simple split-ring resonator (SRR) comprising a planar metallic ring with a gap.
Figure 2:
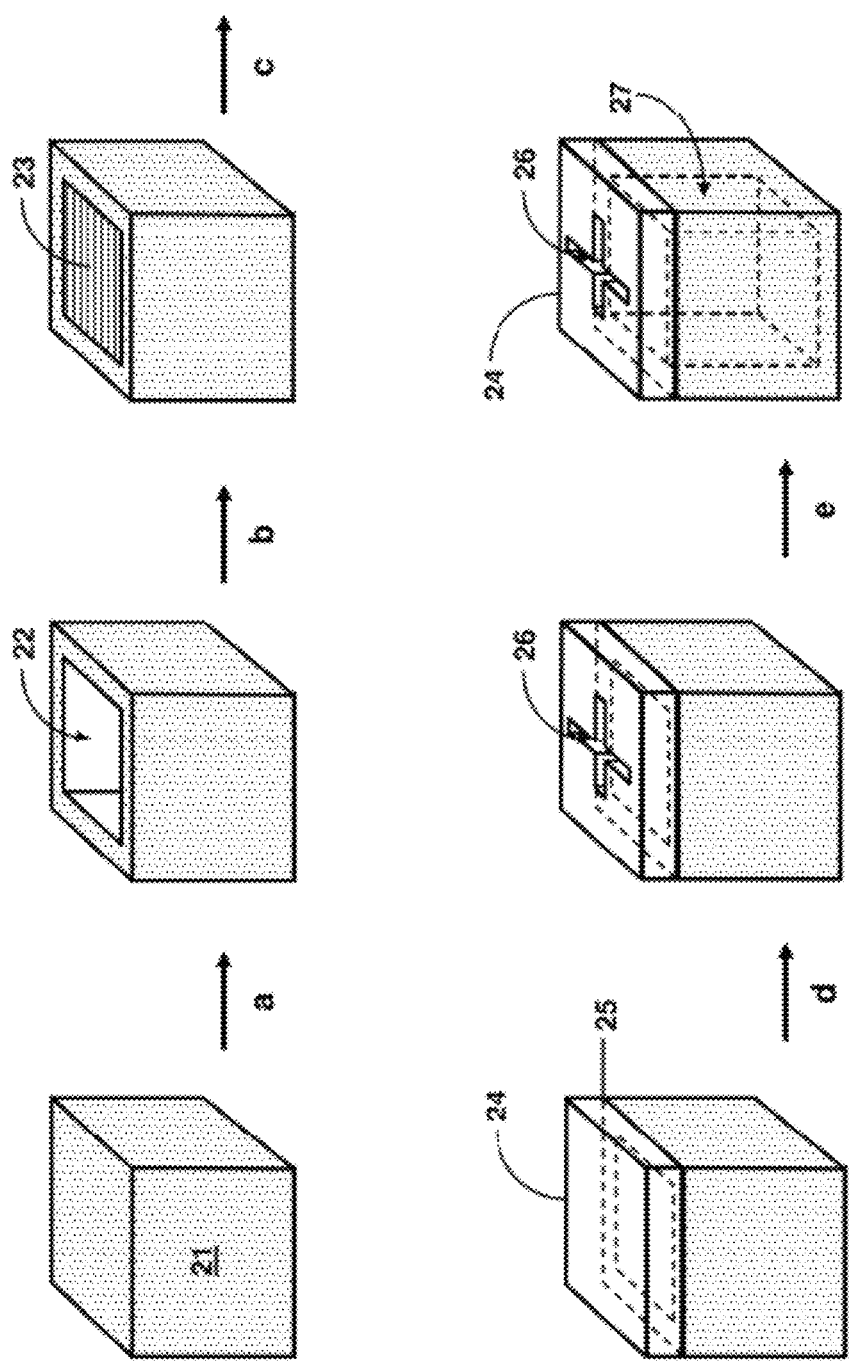
FIG. 2 is a schematic representation for a method to fabricate a cubic 3D metamaterial.

FIG. 2 is a schematic illustration of a fabrication method of the present invention. For the purpose of illustration, the fabrication method is described with respect to a single unit cell of a matrix material 21. However, the method is generally applicable to arrays of unit cells using standard semiconductor processing equipment and materials, as will be apparent from the description that follows. The choice of the matrix material depends on the desired electromagnetic performance and structural and processing characteristics. For a low-loss metamaterial, the matrix material preferably has a low intrinsic loss in the wavelength band of interest. Exemplary matrix materials include photoresists, such as polymethylmethacrylate (PMMA), epoxy-based SU-8, polyethylene, and benzocyclobutene-based polymers; semiconductors, such as silicon, gallium arsenide, and germanium; and dielectrics, such as silica and silicon dioxide. At step a, a cavity 22 is formed in each unit cell of the matrix material 21 with a depth equal to the height of the unit cell. The cavity 22 can either be formed via etching a void or by depositing the bottom and side walls of the cavity (e.g., via lithographically or otherwise). At step b, a sacrificial backfill material 23 is deposited into the cavity 22 and planarized to support a subsequent membrane layer 24. The sacrificial backfill material 23 can be later selectively removed using an etching or dissolution mechanism which will not affect either the membrane or cavity wall materials. Therefore, exemplary sacrificial backfill materials include silicon, silicon dioxide, polyimide, and photoresist. At step c, the membrane layer 24 is deposited on the planarized backfill material 23. Exemplary membrane materials include photoresists, silicon, silicon dioxide, silicon nitride, and metals, such as aluminium, chromium, and titanium. The membrane layer material can be later removed with a selective etchant. Alternatively, a release layer 25 can be deposited prior to deposition of the membrane layer 24 to enable later lift off of the membrane. At step d, the membrane layer 24 is patterned to provide a mask opening 26 that images the desired resonator structure (e.g., a patterned cross in this example) using standard lithographic techniques. At step e, the sacrificial backfill material 23 an then be removed through the mask opening 26 to provide a cavity 27 underneath the patterned membrane 24.

A 3D metamaterial can be fabricated using consecutive off-normal and/or normal depositions of a resonator material through the mask opening 26. The deposition method preferably comprises a high-vacuum deposition method (e.g., e-bean evaporation or physical vapor deposition) such that the deposited resonator structure accurately replicates the membrane pattern. For example, at step f, a first directional deposition 28 of the resonator material can be made with a deposition source tilted at 45° away from the mask normal N (i.e., at 45° into the plane of the figure), thereby depositing a first resonator structure 31 on the inside of the front wall of the cavity 27. The top of the membrane layer will also be coated with resonator material. At step g, a second directional deposition 29 of the resonator material can be made with the deposition source tilted at 45° away from the mask normal N and spread out 90° azimuthally from the first deposition in the plane of the figure), thereby depositing a second resonator structure 32 on another interior side wall of the cavity 27. At step h, two additional off-normal depositions and a normal deposition results in three additional resonator structures 33, 34, and 35 being deposited on the interior side, back, and bottom walls of the cavity 27. At step i, the coated membrane layer 24 can then be removed by selective etching of the membrane material 24, or by lift off of the release layer 25, to provide a unit cell 36 comprising a plurality of 3D resonator structures 31, 32, 33, 34, and 35 deposited on the inner walls of the exposed cavity 27.

Alternatively, a portion of a resonator structure can be deposited with each deposition. A composite resonator structure can thereby be fabricated by "tiling" the portions resulting from consecutive depositions at prescribed angles.

A planar array of such 3D unit cells can be formed in a single plane by forming an array of cavities in a matrix material and making consecutive off-normal and normal depositions through a patterned membrane comprising a mask opening above each cavity, as described above. All of the openings can image the same type of resonator structure, or the openings can image different types of resonator structures. For example, one row of openings can image a first type of resonator structure and a second row of openings can image a second type of resonator structure. Further, a volumetric array of unit cells can be formed by a layer-by-layer build up of additional planes of unit cells on a first planar array. To build up additional planes, at step j, another backfill material 37 can be deposited into the cavities 27 of each of the unit cells in the first planar array layer. The backfill material 37 need not be the same as the sacrificial backfill material 23. Further, the backfill material 37 may or may not be a sacrificial material. For example, it may be advantageous to create solid 3D metamaterials. Therefore, with the resonators already deposited on the interior walls, the cavities can be backfilled with a permanent backfill material, or the matrix material itself, for improved structural or electromagnetic performance. A second layer of unit cells can then be formed on the first layer be repeating the steps a through i to provide a second planar array layer 39 on the first layer 38. If sacrificial, the backfill material 37 can be then be removed from the first layer. Alternatively, a permanent backfill material can be left in the array layers. Additional layers can be formed by this layer-by-layer build-up process to provide a 3D metamaterial 30 comprising one or more layers of planar arrays, each plane with one or more 3D unit cells of resonator structures.

With the fabrication method described above, the cavity formation is completely decoupled from the membrane patterning such that these separate steps can be optimized independently for added application functionality. The cavity shape is determined lithographically and therefore is completely flexible (e.g., curved, cylindrical, spherical, ellipsoidal, cubic, prismatoidal, or conic shapes can be formed), depending on the electromagnetic behavior desired. The electromagnetic behavior can also be modified by adjusting the wall width, wall material, and cavity dimensions. The electromagnetic behavior is also affected by resonator structure, symmetry, and orientation, and the number of resonators per unit cell. The exemplary cross structure shown in FIG. 2 is symmetric with respect to projection along the coordinate axes of the cube. If the membrane mask layer is sufficiently thin compared to the lateral dimensions of the pattern, the cross is accurately reproduced on an interior side wall of the cubic cavity after a 45° directional deposition. However, resonator structures such as a "C" shaped SRR do not possess this symmetry, and hence will be oriented differently on the different interior faces of cubic cavities. This broken symmetry will influence the electromagnetic behaviour of the resulting 3D metamaterial. Alternatively, it is also possible to expand the extent of the "unit cell" to include the four nearest neighbour cells, and pattern them in such a way that the adjacent interior faces of the cavities possess structures with the appropriate resonator configurations.

The details of the fabrication method will depend on the choice of matrix material, backfill material, and membrane material. Described below are examples of different material combinations that can be used with the method of the present invention. Other material combinations and fabrication variations will be will be apparent to those of skill in the art.

Example 1

Polysilicon Matrix, Silicon Dioxide Backfill, and Photoresist Membrane

Polysilicon is deposited on a substrate with a thickness of the unit cell. Plasma etching is used to form a cavity in the polysilicon. The cavity is backfilled with sacrificial silicon dioxide and planarized using chemical mechanical polishing. Standard novolak resin photoresist is spun on the planarized backfill and patterned lithographically to image the desired resonator structure. With the membrane patterned, the underlying silicon dioxide can be removed chemically using either liquid or vapor phase HF, which will not dissolve either the photoresist membrane or the silicon matrix. After the evaporations depositing the resonators on the inner walls of the cavity, the membrane, which is coated with the resonator material from the resonator depositions, is removed. The void of the cavity provides access to the uncoated back side of the membrane, enabling a lift off process to remove the coated membrane. With a photoresist membrane, acetone can be used to dissolve the coated membrane in this lift off process. The acetone completely dissolves the photoresist while leaving the underlying matrix material untouched.

Example 2

Fused Silica (Quartz) Matrix, Polysilicon Backfill, and Photoresist Membrane

Plasma etching is used to form a cavity in the fused silica. The cavity is backfilled with polysilicon and planarized using chemical mechanical polishing. Standard novolak resin photoresist is spun on the planarized polysilicon and patterned lithographically with the desired resonator pattern. With the membrane patterned, the underlying polysilicon can be removed chemically using vapor phase $XeF_2$, which will not dissolve either the photoresist membrane or the fused silica matrix. After the evaporations depositing the resonators on the inner walls of the cavity, the membrane, which is coated with the resonator material, is removed. With a photoresist membrane, acetone can be used to dissolve the coated membrane in a lift off process. The acetone completely dissolves the photoresist while leaving the underlying matrix material untouched.

Example 3

Polysilicon Matrix, Developable Polyimide Backfill, Oxide Release Layer, and Low-Stress Silicon Nitride Membrane Polysilicon is deposited on a substrate with a thickness of the unit cell. Plasma etching is used to form a cavity in the polysilicon. The cavity is backfilled with polyimide and planarized using chemical mechanical polishing. A silicon dioxide release layer is deposited on the planarized polyimide backfill, followed by deposition of a low-stress silicon nitride membrane layer on the release layer. Photoresist is spun on and patterned lithographically with the desired resonator pattern. The oxide/nitride stack is then patterned with reactive ion etching. With the membrane patterned, the underlying polyimide can be removed using tetramethylammonium hydroxide (TMAH) developer, which will not dissolve the oxide release layer, the nitride membrane, or the silicon matrix. After the evaporations depositing the resonators on the inner walls of the cavity, the membrane, which is coated with the resonator material, is removed. Either liquid or vapor phase HF can dissolve the silicon dioxide release layer, taking with it the coated nitride membrane in a liftoff process. The HF completely dissolves the oxide while leaving the underlying matrix material untouched.

Example 4

Polysilicon Matrix, Developable Polyimide Backfill, and PMMA Membrane

Polysilicon is deposited on a substrate with a thickness of the unit cell. Plasma etching is used to from a cavity in the polysilicon. The cavity is backfilled with a basic developable polyimide, which when baked below the imidization temperature, is dissolvable in standard basic (TMAH) photoresist developer. The polyimide backfill can be planarized using either an aqueous developer or oxygen plasma etch-back. PMMA is spun on and patterned using e-beam lithography to image the desired resonator pattern. The PMMA developer is a solvent-based methyl isopropyl ketone (MiK), which does not affect the polyimide backfill. With the membrane patterned, the underlying polyimide is dissolved out using standard TMAH photoresist developer. After the evaporations defining the resonators on the inner walls of the cavity, the membrane, which is coated with the resonator material, is removed. With a PMMA membrane, acetone can be used to dissolve the coated membrane in a lift off process. The acetone completely dissolves the PMMA while leaving the underlying matrix material untouched.

Example 5

SU-8 Photoresist Matrix, Developable Polyimide Backfill, PMMA Membrane

SU-8 is deposited on a substrate with a thickness of the unit cell. SU-8 is an epoxy-based negative photoresist. Optical lithography can be used to pattern the SU-8 with cavities. Therefore, after forming the cavities, the SU-8 can be flood exposed and hard baked to fully crosslink the polymer, making it immune to dissolution from solvents. The cavity is backfilled with a basic developable polyimide, which when baked below the imidization temperature, is dissolvable in standard basic (TMAH) photoresist developer. The polyimide backfill can be planarized using either an aqueous developer or oxygen plasma etch-back. PMMA is spun on and patterned using e-beam lithography with the desired resonator pattern. The PMMA developer is a solvent-based MiK, which does not affect the polyimide backfill. With the membrane patterned, the underlying polyimide is dissolved out using standard TMAH based photoresist develop After the evaporations defining the resonators on the inner walls of the cavity, the membrane, which is covered with the resonator material, is removed. With a PMMA membrane, acetone can be used to dissolve the coated membrane in a lift off process. The acetone completely dissolves the PMMA while leaving the underlying matrix material untouched.

Method of Fabrication by Self-Aligned Cavity Membrane Projection Lithography

Figure 3:
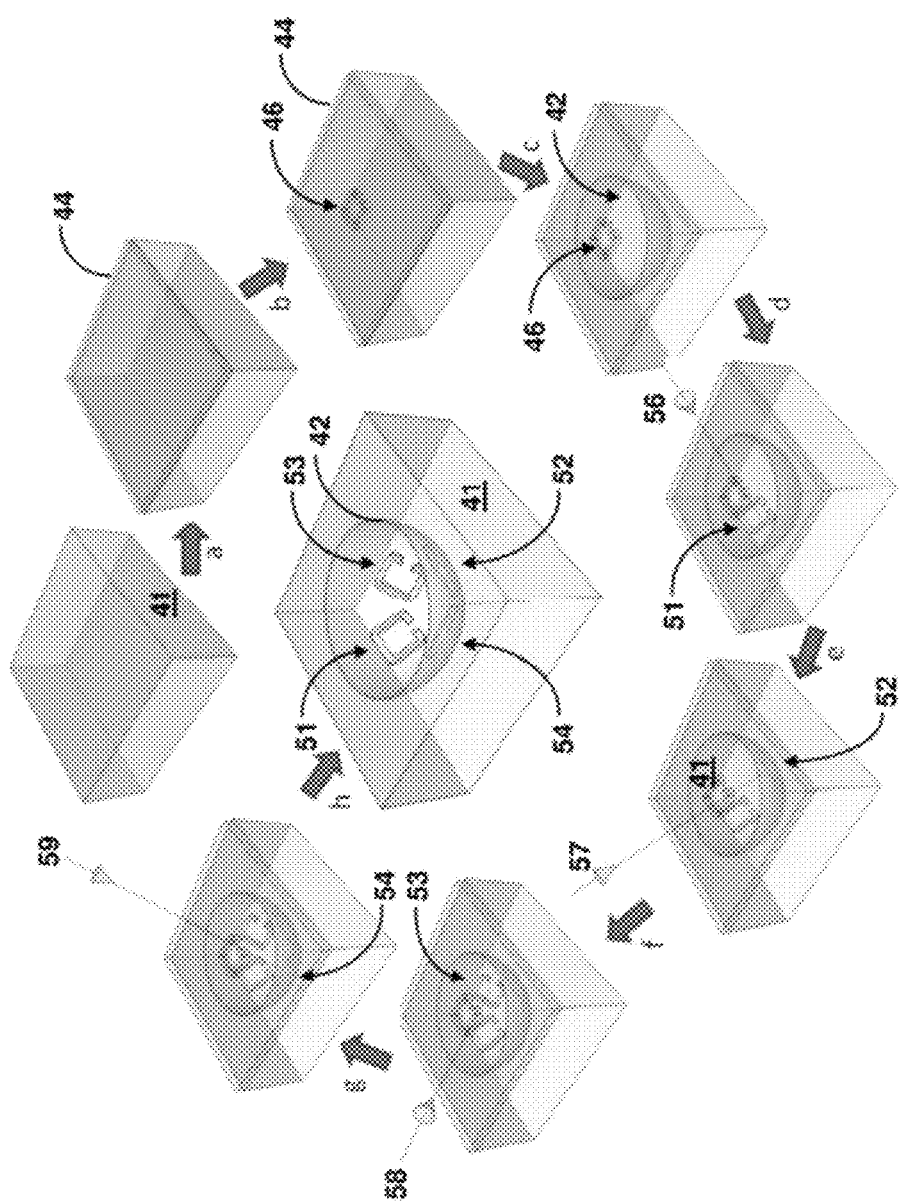
FIG. 3 is a schematic illustration of a method to fabricate 3D metamaterial using self-aligned cavity membrane projection lithography.
Figure 4:
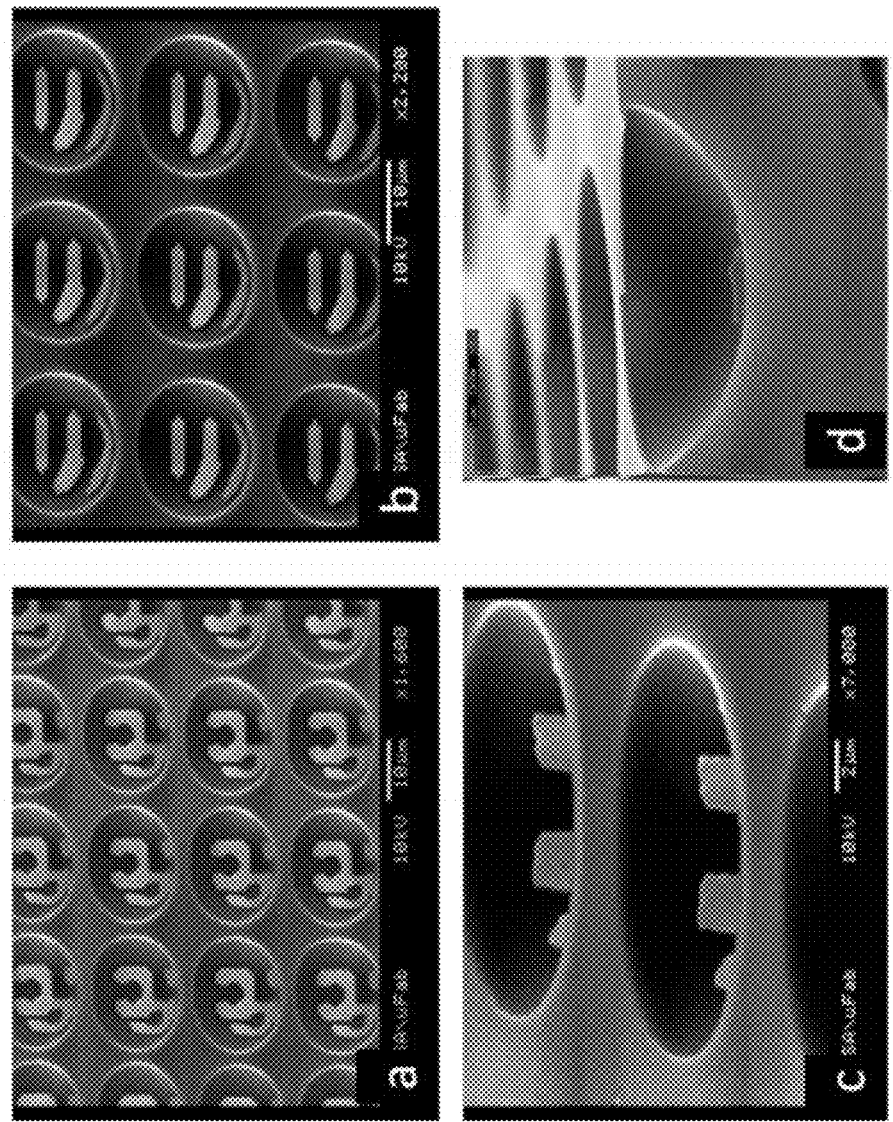
FIGS. 4a-d are scanning electron microscope (SEM) images of generic metamaterial resonators on curved surfaces.
Figure 5:
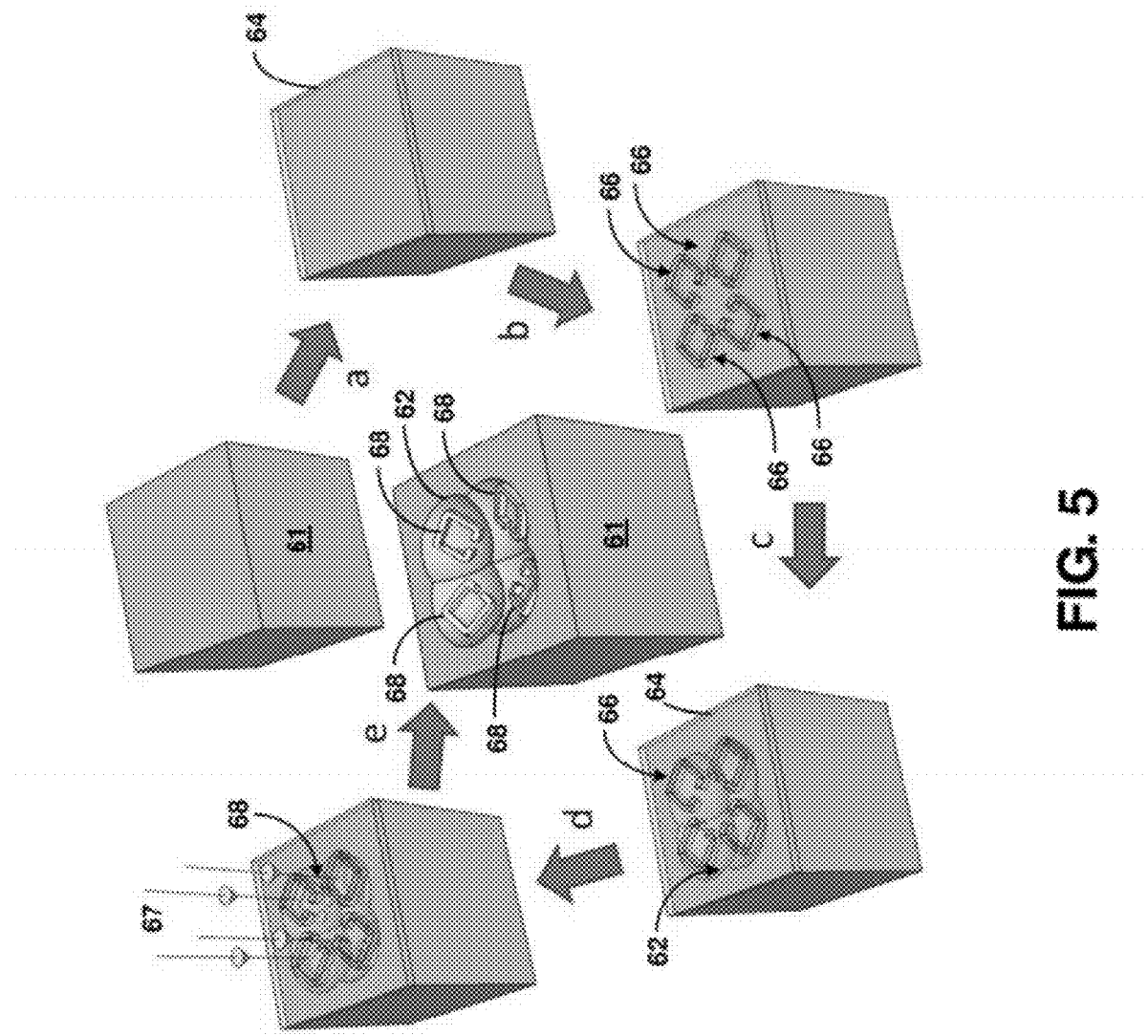
FIG. 5 is a schematic illustration of an alternative method to fabricate 3D metamaterial using self-aligned cavity membrane projection lithography.

In FIG. 3 is shown a schematic illustration of another fabrication method that uses self-aligned cavity membrane projection lithography (SAMPL). The method is capable of generating 3D metamaterials comprising generic resonator structures, such as SRRs and SWPs, on a micron/sub-micron size scale on concave cavity surfaces with a radius of curvature approximately equal to the resonator structure lateral dimension. The description below focuses on the fabrication of curved cavities and the role of curvature in the electromagnetic response. However, the method can also be used for the fabrication of cubic unit cells, as described previously.

A starting matrix material 41 is deposited on a suitable substrate. At step a, a membrane material 44 is deposited on the matrix material 41. At step b, the membrane can be patterned using standard lithography (e.g., conventional contact lithography, semiconductor stepper, or e-beam lithography) to provide a mask opening 46 in the patterned membrane 44. At step c, the mask opening 46 provides an access port through which the matrix material immediately beneath the opening can be etched away, forming a cavity 42 in the matrix material beneath the membrane layer. The interaction of the mask pattern symmetry and the isotropy of the matrix material dissolution dictates the cavity shape; for highly isotropic dissolution through a highly symmetric mask pattern, the cavity can be nearly hemispherical, whereas for anisotropic etches or highly asymmetrical mask patterns, the cavity can be a more complex shape. Regardless, the mask opening 46 images a resonator structure positioned in a self-aligned manner over the resulting cavity 42. Directional evaporation can be used to deposit the resonator material on the inner surface of the cavity. At steps d-g, multiple depositions 56, 57, 58, and 59 can occur through the mask opening 46 at different orientations providing multiple resonator structures 51, 52, 53, and 54 deposited on the inner surface of the cavity 42. Finally, at step h, the membrane 44 can be removed, exposing the cavity 42 with the deposited resonator structures 51, 52, 53, and 54 on the inner surface. Multiple cells can be fabricated in a single plane and a volumetric array of unit cells can be formed by a layer-by-layer build up of additional planes of unit cells, as described above.

Example 6

Self-Aligned Polysilicon Matrix and Photoresist Membrane

Polysilicon is deposited on a substrate with a thickness of the unit cell. Standard photoresist is spun on the polysilicon and patterned lithographically to image the desired resonator structure. With the membrane patterned, the underlying silicon immediately beneath the patterned membrane is removed chemically using vapor phase $XeF_2$ or $SF_6$, which will not dissolve the photoresist membrane, forming a self-aligned cavity. After the evaporations depositing the resonators on the inner walls of the cavity, the membrane, which is coated with the resonator material from the resonator depositions, is removed. The void of the cavity provides access to the uncoated back side of the membrane, enabling a lift off process to remove the coated membrane. With a photoresist membrane, acetone can be used to dissolve the coated membrane in this lift off process. The acetone completely dissolves the photoresist while leaving the underlying matrix material untouched.

Example 7

Self-Aligned Polyimide Matrix and Photoresist Membrane

Polyimide is deposited on a substrate with a thickness of the unit cell. Standard photoresist is spun on the polyimide and patterned lithographically to image the desired resonator structure. The photoresist developer isotropically dissolves the polyimide immediately beneath the patterned membrane, resulting in a self-aligned cavity. After the evaporations depositing the resonators on the inner walls of the cavity, the membrane, which is coated with the resonator material from the resonator depositions, is removed. The void of the cavity provides access to the uncoated back side of the membrane, enabling a lift off process to remove the coated membrane. With a photoresist membrane, acetone can be used to dissolve the coated membrane in this lift off process. The acetone completely dissolves the photoresist while leaving the underlying matrix material untouched.

Example 8

Self-Aligned Silicon Oxide Matrix and Photoresist Membrane

Silicon oxide is deposited on a substrate with a thickness of the unit cell. Standard photoresist is spun on the oxide and patterned lithographically to image the desired resonator structure. With the membrane patterned, the underlying oxide immediately beneath the patterned membrane is removed chemically using vapor or liquid phase HF, which will not dissolve either the photoresist membrane, forming a self-aligned cavity. After the evaporations depositing the resonators on the inner walls of the cavity, the membrane, which is coated with the resonator material from the resonator depositions, is removed. The void of the cavity provides access to the uncoated back side of the membrane, enabling a lift off process to remove the coated membrane. With a photoresist membrane, acetone can be used to dissolve the coated membrane in this lift off process. The acetone completely dissolves the photoresist while leaving the underlying matrix material untouched.

FIGS. 4a-d show SEM images of various structures fabricated using the exemplary SAMPL method described above. To fabricate the structures, a developable polyimide was first deposited on a silicon wafer and baked at 186° C. AZ5214 photoresist was spun-on at 3000 RPM and soft-baked at 90° C. for 3 minutes. Contact lithography was used to expose the resist, followed by development in AZ400K (diluted 1:4 400K:$H_2O$) for about 45 seconds, resulting in the developed pattern and a self-aligned cavity. Three successive e-beam evaporations of a Ti/Au stack (100 Å/500 Å) were performed at an angle of 45° with respect to the mask normal, Finally, the metal-coated photoresist membrane was removed via lift off in acetone to yield the final metamaterial structure.

It is apparent from the SEM images that the lateral dimensions of the cavity were too small to accommodate three non-overlapping replications of the mask pattern. This can be corrected by creating larger cavities, or evaporating at a more oblique angle of incidence. Nevertheless the resulting SEM images show a patterned dielectric with metallic resonators of various shapes positioned on its interior wall. Although the patterned membrane mask was formed using planar lithography, the projection deposition creates resonators which exist on the curved face of the cavity, and hence are inherently non-planar.

An alternative SAMPL method is to pattern the membrane with the full suite of resonator structures to be deposited in the unit cell in a single lithography step. With this alternative, the cavity is still self-aligned but only a single normally incident evaporation can be used to deposit multiple resonator structures in the cavity. A starting matrix material 61 is deposited on a suitable substrate. At step a, a membrane material 64 is deposited on the matrix material 61. At step b, the membrane 64 can be patterned using standard lithography (e.g., conventional contact lithography, semiconductor stepper, or e-beam lithography) to provide a plurality of mask openings 66 in the membrane. At step c, the mask openings 66 provide access ports through which the matrix material 61 immediately beneath the openings can be etched away to provide a cavity 62 beneath the membrane layer 64. The interaction of the mask pattern symmetry and the isotropy of the matrix material dissolution dictates the cavity shape; for highly isotropic dissolution with highly symmetric mask patterns, the cavity can be nearly hemispherical, whereas for anisotropic etches or highly asymmetrical mask patterns, the cavity can be a more complex shape. The mask openings image resonator structures positioned in a self-aligned manner over the cavity. Directional evaporation can be used to deposit the resonator material on the inner surface of the cavity. At steps d, a single directed deposition 67 through the mask openings 66 can be used to deposit an equal number of resonator structures 68 on the inner surface on the cavity 62 in a self-aligned manner. Finally, at step e, the membrane 64 can be removed, exposing the cavity 62 with the deposited resonator structures 68 on the inner surface. Multiple cells can be fabricated in a single plane and a volumetric array of unit cells can be formed by a layer-by-layer build up of additional planes of unit cells, as described above.

Figure 6:
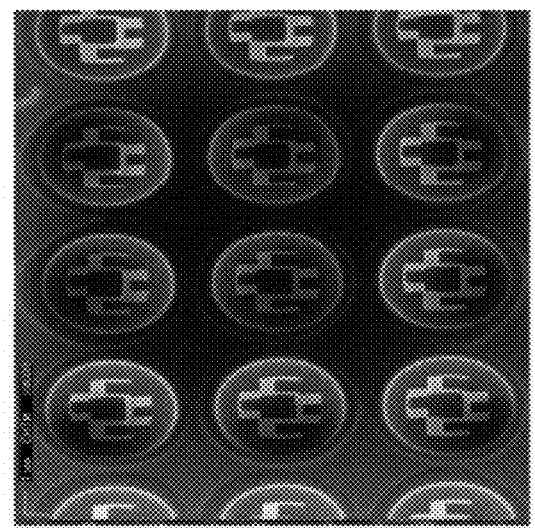
FIGS. 6a-c are SEM images of C-shaped resonators in a spherical cavity.
Figure 6:
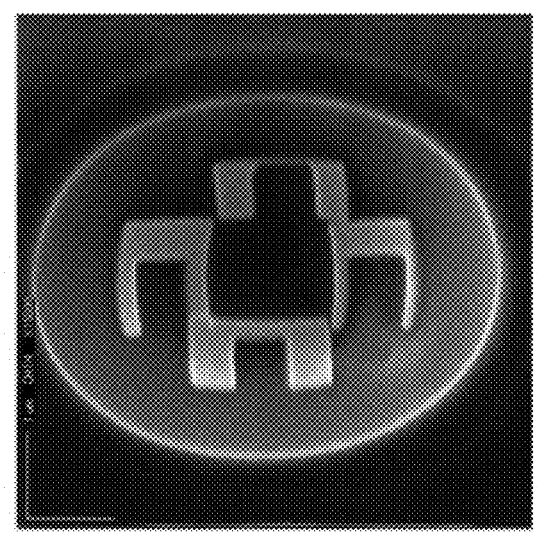
Figure 6:
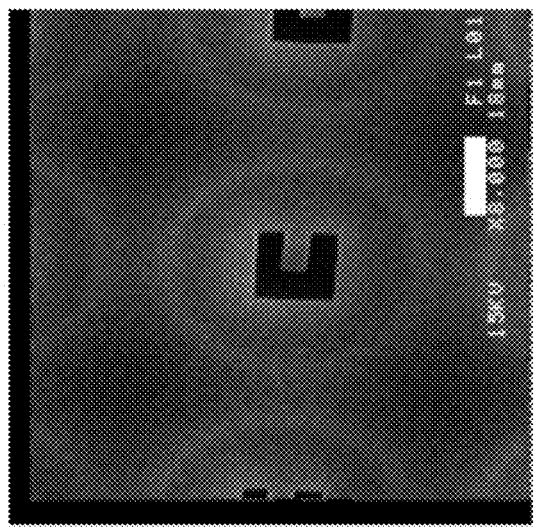

FIG. 6a shows a top-down SEM image of a patterned membrane PMMA membrane above a self-aligned cavity. FIG. 6b shows an array of C-shaped resonators in a spherical cavity after four consecutive Ti/Au e-beam evaporations and lift off of the membrane. The C-shaped resonators are about 1.8 microns a side. Some of the deposited line structures are less than 100 nm wide. FIG. 6c shows a planar array of metamaterial cavities.

The present invention has been described as three-dimensional metamaterials and methods to fabricate three-dimensional metamaterials. It will be understood that the above description is merely illustrative of the applications of the principles of the present invention, the scope of which is to be determined by the claims viewed in light of the specification. Other variants and modifications of the invention will be apparent to those of skill in the art.

I claim:

1. A method for fabricating a three-dimensional metamaterial, comprising:
    forming a patterned membrane over a cavity in a matrix material, wherein the patterned membrane comprises at least one mask opening that images a resonator structure, and
    directionally depositing at least one resonator structure on an inner wall surface of the cavity through the at least one mask opening in the patterned membrane to reproduce the pattern on the inner wall surface.

2. The method of claim 1, wherein the step of forming a patterned membrane over a cavity comprises forming a patterned membrane over the matrix material and etching the cavity through the at least one mask opening.

3. The method of claim 1, wherein the step of forming a patterned membrane over a cavity comprises forming a cavity in the matrix material, depositing a sacrificial backfill material into the cavity, planarizing the surface of the deposited sacrificial backfill material, depositing a membrane layer on the planarized sacrificial backfill material, patterning the membrane layer to provide the at least one mask opening, and removing the sacrificial backfill material through the at least one mask opening.

4. The method of claim 1 wherein the step of directionally depositing at least one resonator structure comprises depositing two or more resonator structures at different deposition angles through a single mask opening.

5. The method of claim 1, further comprising depositing the matrix material on a substrate prior to the step of forming a patterned membrane over a cavity.

6. The method of claim 1, further comprising removing the patterned membrane after the step of directionally depositing, thereby exposing the cavity with the deposited resonator structures on the inner surface.

7. The method of claim 1, further comprising depositing a backfill material in the exposed cavity.

8. The method of claim 1, wherein the resonator structure comprises a split-ring resonator, cut-wire pair, or split-wire pair.

9. The method of claim 1, wherein the resonator structure comprises a metal or dielectric.

10. The method of claim 1, wherein the membrane comprises photoresist, silicon, silicon dioxide, silicon nitride, or metal.

11. The method of claim 1, wherein the matrix material comprises photoresist, semiconductor, or dielectric.

12. The method of claim 3, wherein the sacrificial backfill material comprises silicon, silicon dioxide, polyimide, or photoresist.

13. The method of claim 1, wherein the cavity comprises a curved, cylindrical, spherical, ellipsoidal, cubic, prismatoidal, or conic shape.

14. The method of claim 1, further comprising forming a patterned membrane over a plurality of cavities in a plane of the matrix material, wherein the patterned membrane comprises at least one mask opening that images a resonator structure over each cavity, and directionally depositing at least one resonator structure on an inner surface of each cavity through the patterned membrane, thereby forming a first planar array of unit cells of metamaterial.

15. The method of claim 14, further comprising forming at least one additional planar array of unit cells of metamaterial on the first planar array of unit cells of metamaterial, thereby forming a volumetric array of unit cells of metamaterial.

16. The method of claim 1, wherein the step of directionally depositing at least one resonator structure comprises depositing a portion of a resonator in each of two or more consecutive depositions at different angles to the patterned membrane to provide a composite resonator structure.

* * * * *